United States Patent
James

(10) Patent No.: US 8,105,643 B2
(45) Date of Patent: Jan. 31, 2012

(54) PROCESS FOR PRINTING FEATURES WITH SMALLER DIMENSIONS

(75) Inventor: Anthony James, Rio Rancho, NM (US)

(73) Assignee: Cabot Corporation, Boston, MA (US)

(*) Notice: Subject to any disclaimer, the term of this patent is extended or adjusted under 35 U.S.C. 154(b) by 1645 days.

(21) Appl. No.: 11/443,310

(22) Filed: May 31, 2006

(65) Prior Publication Data

US 2007/0277685 A1 Dec. 6, 2007

(51) Int. Cl.
*B05D 5/12* (2006.01)
(52) U.S. Cl. .......... 427/96.1; 427/98.4; 427/58
(58) Field of Classification Search .......... None
See application file for complete search history.

(56) References Cited

U.S. PATENT DOCUMENTS

| | | | |
|---|---|---|---|
| 3,957,694 A | 5/1976 | Bolon et al. |
| 4,051,074 A | 9/1977 | Asada |
| 4,388,346 A | 6/1983 | Bickler |
| 4,487,811 A | 12/1984 | Eichelberger et al. |
| 4,594,311 A | 6/1986 | Frisch et al. |
| 4,697,041 A | 9/1987 | Okaniwa et al. |
| 4,746,838 A | 5/1988 | Kay |
| 4,877,451 A | 10/1989 | Winnik et al. |
| 5,132,248 A | 7/1992 | Drummond et al. |
| 5,679,724 A | 10/1997 | Sacripante et al. |
| 5,725,647 A | 3/1998 | Carlson et al. |
| 5,750,194 A | 5/1998 | Watanabe et al. |
| 5,814,683 A | 9/1998 | Branham |
| 5,837,041 A | 11/1998 | Bean et al. |
| 5,837,045 A | 11/1998 | Johnson et al. |
| 5,853,470 A | 12/1998 | Martin et al. |
| 5,882,722 A | 3/1999 | Kydd |
| 6,080,928 A | 6/2000 | Nakagawa |
| 6,159,267 A | 12/2000 | Hampden-Smith et al. |
| 6,165,247 A | 12/2000 | Kodas et al. |
| 6,184,457 B1 | 2/2001 | Tsuzuki et al. |
| 6,268,014 B1 | 7/2001 | Eberspacher et al. |
| 6,274,412 B1 | 8/2001 | Kydd et al. |
| 6,277,169 B1 | 8/2001 | Hampden-Smith et al. |
| 6,316,100 B1 | 11/2001 | Kodas et al. |
| RE37,512 E | 1/2002 | Szlufcik et al. |
| 6,338,809 B1 | 1/2002 | Hampden-Smith et al. |
| 6,379,745 B1 | 4/2002 | Kydd et al. |
| 6,413,790 B1 | 7/2002 | Duthaler et al. |
| 6,506,438 B2 | 1/2003 | Duthaler et al. |
| 6,697,694 B2 | 2/2004 | Mogensen |
| 6,811,885 B1 | 11/2004 | Andriessen et al. |

(Continued)

FOREIGN PATENT DOCUMENTS

EP 2270872 5/2001

(Continued)

OTHER PUBLICATIONS

Communication Relating to the Results of the Partial International Search received in the corresponding international application No. PCT/US2007/070144.

(Continued)

*Primary Examiner* — Matthew Luu
*Assistant Examiner* — Justin Seo

(57) ABSTRACT

The invention relates generally to a printing process. In particular, the invention relates to a printing process where a first-printed feature or vanishing trace causes a second-printed feature to have a smaller dimension than it would in the absence of the first-printed feature or vanishing trace.

38 Claims, 11 Drawing Sheets

U.S. PATENT DOCUMENTS

| | | | |
|---|---|---|---|
| 6,814,795 B2 | 11/2004 | McVicker et al. | |
| 6,951,666 B2 | 10/2005 | Kodas et al. | |
| 6,958,095 B2 | 10/2005 | Kakimoto et al. | |
| 7,115,218 B2 | 10/2006 | Kydd et al. | |
| 7,524,528 B2 | 4/2009 | Kodas et al. | |
| 7,533,361 B2 | 5/2009 | Edwards | |
| 7,553,512 B2 | 6/2009 | Kodas et al. | |
| 7,585,349 B2 | 9/2009 | Xia et al. | |
| 7,597,769 B2 | 10/2009 | Hampden-Smith et al. | |
| 7,625,420 B1 | 12/2009 | Kodas et al. | |
| 7,629,017 B2 | 12/2009 | Kodas et al. | |
| 2002/0146564 A1 | 10/2002 | Takai et al. | |
| 2003/0003231 A1 | 1/2003 | Kiguchi et al. | |
| 2003/0009726 A1 | 1/2003 | Chang et al. | |
| 2004/0075196 A1* | 4/2004 | Leyden et al. | 264/401 |
| 2004/0238816 A1 | 12/2004 | Tano et al. | |
| 2005/0151820 A1* | 7/2005 | Sirringhaus et al. | 347/107 |
| 2006/0159603 A1 | 7/2006 | Vanheusden et al. | |
| 2006/0189113 A1 | 8/2006 | Vanheusden et al. | |
| 2008/0089839 A1* | 4/2008 | Lu et al. | 424/9.1 |
| 2009/0053400 A1 | 2/2009 | la Vega et al. | |

FOREIGN PATENT DOCUMENTS

| | | |
|---|---|---|
| EP | 1801890 | 3/2010 |
| JP | 2004235272 | 8/2004 |
| WO | 9919900 | 4/1999 |
| WO | 02073712 A | 9/2002 |
| WO | 02087749 | 11/2002 |
| WO | 03016961 | 2/2003 |
| WO | 03056641 A | 7/2003 |
| WO | 03100860 A2 | 12/2003 |
| WO | 2005022664 A | 3/2005 |
| WO | 2006078825 | 7/2006 |
| WO | 2007053408 | 5/2007 |
| WO | 2007149883 | 12/2007 |

OTHER PUBLICATIONS

Vanheusden, Karel, et al., "Production of Metal Nanoparticles" U.S. Appl. No. 11/331,230, filed Jan. 13, 2006.

Teng, et al., Liquid Ink Jet Printing with MOD Inks for Hybrid Microcircuits, IEEE Transactions on Components, Hybrids, and Manufacturing Technology, vol-CHMT-12. No. 4. Dec. 1987.

Palchik et al., Preparation and Characterization of Ni/NiO Composite using Microwave Irradiation and Sonication, NanoStructured Materials, vol. 11. No. 3, pp. 415-420, 1999.

Kwon, Viscosity of magnetic particle suspension, Journal of Molecular Liquids 75 (1998) 115-126.

Silvert et al., Preparation of colloidal silver dispersions by the polyol process, Part 2—Mechanism of particle formation, J. Mater Chem., 1997, 7(2), pp. 293-299.

* cited by examiner

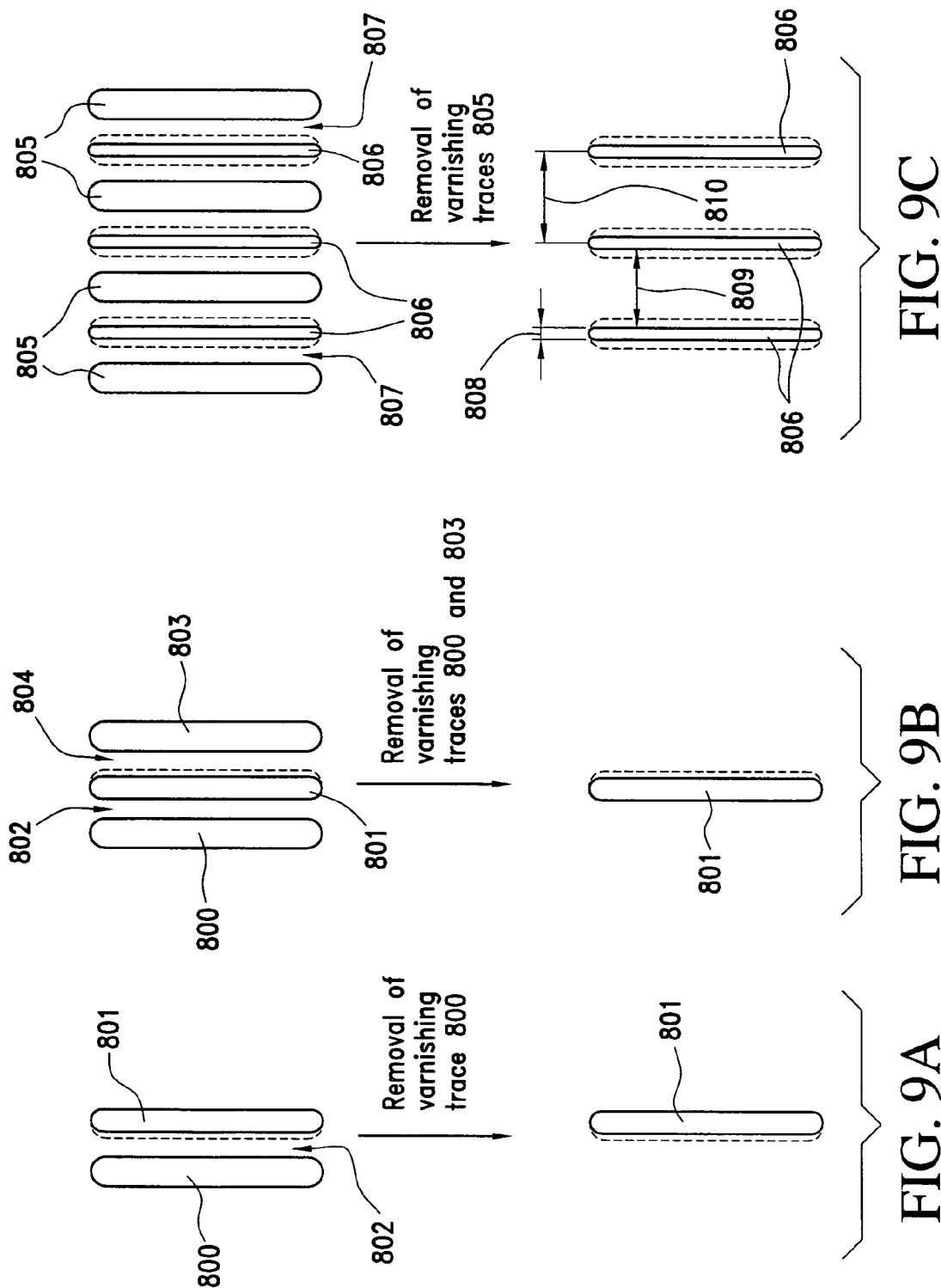

PROCESS FOR PRINTING FEATURES WITH SMALLER DIMENSIONS

FIELD OF INVENTION

The invention relates generally to a printing process. In particular, the invention relates to a printing process where a first-printed feature or vanishing trace causes a second-printed feature to have a smaller dimension than it would in the absence of the first-printed feature or vanishing trace.

BACKGROUND OF THE INVENTION

The need for printing features with smaller and smaller dimensions (e.g., width) on substrates is never satisfied. The miniaturization of electronic devices, for example, requires the miniaturization of electronic circuits. Such miniaturized electronic circuits comprise electrically conductive features that, as a result of the miniaturization of the circuit, must have the smallest dimension (e.g., width) possible.

Conventional techniques for the fabrication of conductive features on a substrate include a number of different processes include: photolithography; vacuum deposition; chemical vapor deposition; oxidation; etching; masking; and dopant diffusion. Such processes have drawbacks. For example, etching and dopant diffusion are difficult to accurately control and can lead to loss in accuracy in the shape and performance of the desired feature. Further, photolithography can be costly. Other conventional processes employ additional steps or chemistries that modify a substrate, enhancing the ability of a substrate to de-wet a liquid in order to obtain narrower lines. This type of process, however, is generally global in effect (i.e., it can not be easily localized to a desired area on the substrate).

There is therefore a need for a process that not only avoids the drawbacks found in known processes for forming conductive features on a substrate, but that can also provide ultra-thin features in a controlled and reproducible manner.

SUMMARY OF THE INVENTION

The present invention provides a printing process, comprising: printing a first feature and a second feature, separated by a gap, under conditions effective for the first feature to cause the second feature to have a smaller dimension than it would in the absence of the first feature.

In another aspect, the invention provides a printing process, comprising: printing at least two adjacent features, separated by a gap, with one or more printing heads set at a saber angle effective to increase the number of effective features per unit area.

In yet another aspect, the invention provides a printing process, comprising: printing a first vanishing trace and a feature, wherein the first vanishing trace and the feature are separated by a gap, under conditions effective for the first vanishing trace to cause the feature to have a smaller dimension than it would in the absence of the first vanishing trace.

BRIEF DESCRIPTION OF THE DRAWINGS

The present invention will be better understood in view of the following non-limiting figures, wherein:

FIGS. 9A-9C present several examples of features that may be printed adjacent to vanishing traces;

DETAILED DESCRIPTION OF THE INVENTION

I. Introduction

Figure 1:
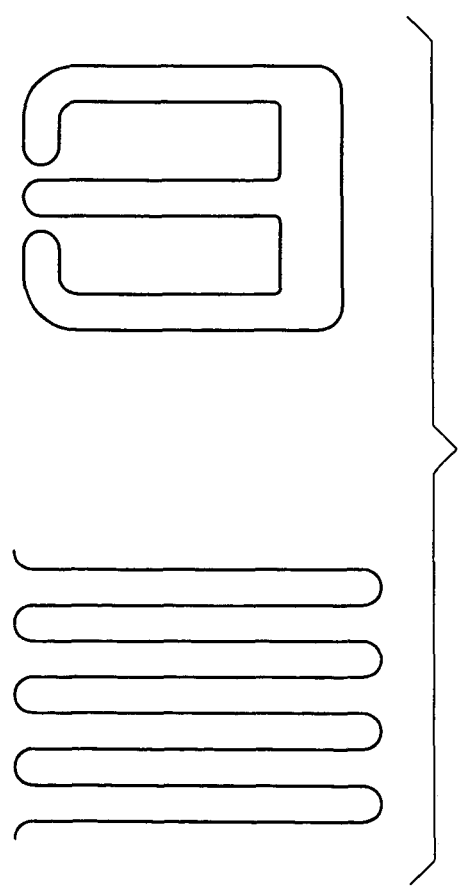
FIG. 1 presents examples of continuous features.

The invention relates generally to a printing process. In one aspect, the printing process comprises printing a first feature and a second feature, separated by a gap, under conditions effective for the first feature to cause the second feature to have a smaller dimension than it would in the absence of the first feature. In an optional embodiment, the process further comprises printing a third feature adjacent to at least one of the first feature or the second feature, wherein the third feature causes the at least one of the first feature or the second feature to have an even smaller dimension than it would in the absence of the third feature.

In a further embodiment, the invention relates to a printing process, comprising: printing a first vanishing trace and a feature, wherein the first vanishing trace and the feature are separated by a gap, under conditions effective for the first vanishing trace to cause the feature to have a smaller dimension than it would in the absence of the first vanishing trace. In an optional embodiment, the printing process further comprises printing a second vanishing trace adjacent to the feature, wherein the second vanishing trace causes the feature to have an even smaller dimension than it would in the absence of the second vanishing trace.

In another embodiment, the invention relates to a printing process, comprising printing at least two adjacent features, separated by a gap, with one or more printing heads set at a saber angle effective to increase the number of effective features per unit area.

The term "feature" as used herein, and in the appended claims, includes any two- or three-dimensional structure including, but not limited to, a line, a shape, an image, a dot, a patch, and a continuous or discontinuous layer (e.g., coating). The features may be electrically conductive or non-conductive, and may be transparent, semi-transparent and/or reflective in the visible light range and/or in any other range such as, e.g., in the UV and/or IR ranges. Thus, the features may be implemented in electronic and non-electronic applications such as, e.g., RF ID antennas and tags, digitally printed multi-layer circuit boards, printed membrane keyboards, smart packages, security features, "disposable electronics" printed on plastics or paper stock, interconnects for applications in printed logic, passive matrix displays, and active matrix backplanes for applications such as OLED displays and TFT AMLCD technology, as discussed in greater detail in, e.g., U.S. patent application Ser. No. 11/331,211, filed Jan. 13, 2006, the disclosure of which is incorporated by reference herein in its entirety.

II. Printing Features with Smaller Dimensions

As stated above, in one embodiment, the invention provides a printing process for printing features with smaller dimensions. As used herein, the term "smaller dimension" means that the feature has a reduced dimension in any direction (e.g., length, width, volume, etc.). Thus, for example, when a feature is a line having a width, the term "smaller dimension" may refer to a smaller lateral dimension, as well as a smaller longitudinal dimension.

Figure 3C:
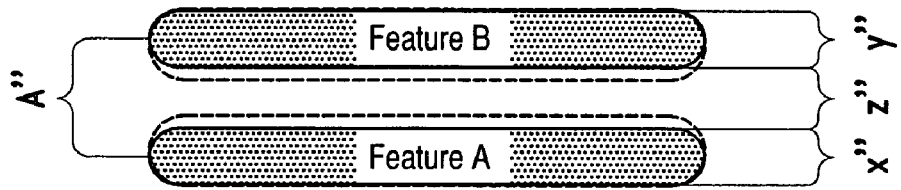
FIGS. 3B and 3C present a first feature and a second feature where the first feature causes the second feature to have a smaller dimension than it would in the absence of the first feature.
Figure 3B:
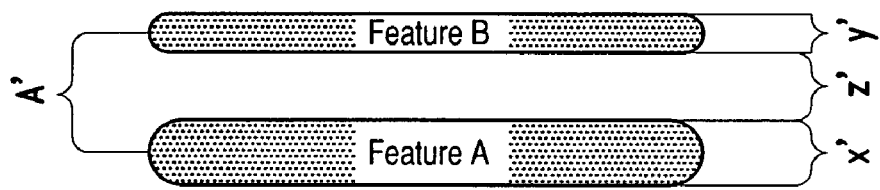
Figure 3A:
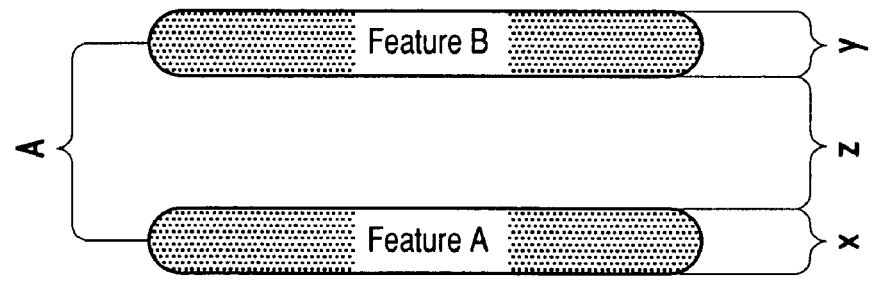
FIG. 3A presents a first feature and a second feature where the first feature does not cause the second feature to have a smaller dimension than it would in the absence of the first feature.

In one embodiment, the features printed comprise substantially parallel lines, each line having a line width, a gap separating adjacent lines and each pair of adjacent lines having a pitch (i.e., the distance between the center of one line to the center of an adjacent line). As used herein, the term "adjacent" as it relates to features (in this case substantially parallel lines) means that the feature is separated by a gap that is less than about 500 µm; for example, not greater than about 300 µm; or not greater than about 100 µm; or not greater than about 10 µm. In a preferred embodiment, the gap separating each adjacent line is from about 500 µm to about 10 µm; or from about 300 µm to about 100 µm. The features may be continuous or discontinuous and still be adjacent. FIG. 1 shows non-limiting examples of continuous features that are never the less adjacent. FIG. 3A, for example, shows discontinuous features that are adjacent.

In one embodiment, the line width is not greater than about 100 µm; for example, not greater than about 50 µm; or not greater than about 10 µm; or not greater than about 1 µm. In a preferred embodiment, the line width is from about 500 µm to about 10 µm; or from about 300 µm to about 100 µm; or from about 50 µm to about 10 µm. In another embodiment, the pitch between adjacent lines is not greater than about 500 µm; for example, not greater than about 250 µm; or not greater than about 50 µm; or not greater than about 5 µm. In a preferred embodiment, the pitch between adjacent lines is from about 1 µm to about 500 µm; or from about 100 µm to about 400 µm; or from about 1 µm to about 200 µm.

When the features printed are substantially parallel lines, in one embodiment, the lines have a pitch to line width ratio of less than 5:1; for example, a pitch to line width ratio of 4:1; or a pitch to line width ratio of 3:1; or a pitch to line width ratio of 2:1; or a pitch to line width ratio of 1:1. In the case of two substantially parallel lines of different widths, the line having the greater width should be used to determine the ratio.

The inventors have unexpectedly discovered that when a feature is printed adjacent to at least one other feature with a gap that is less than about 300 µm separating each feature, that the feature that is printed first has the effect of causing the subsequently printed feature to have a smaller dimension than it would in the absence of the first printed feature. While not being bound by theory, it is believed that at least one factor that causes the subsequently printed feature's dimension to be affected by the first printed feature is a vapor effect of the solvent(s) contained in the vehicle of the ink used to print the first printed feature. As used herein, the term "vapor effect" means a repulsive effect between the vapor generated by the solvent(s) in the ink used to print the first printed feature and the vapor generated by the solvent(s) in the ink used to print the second printed feature.

Figure 2A:
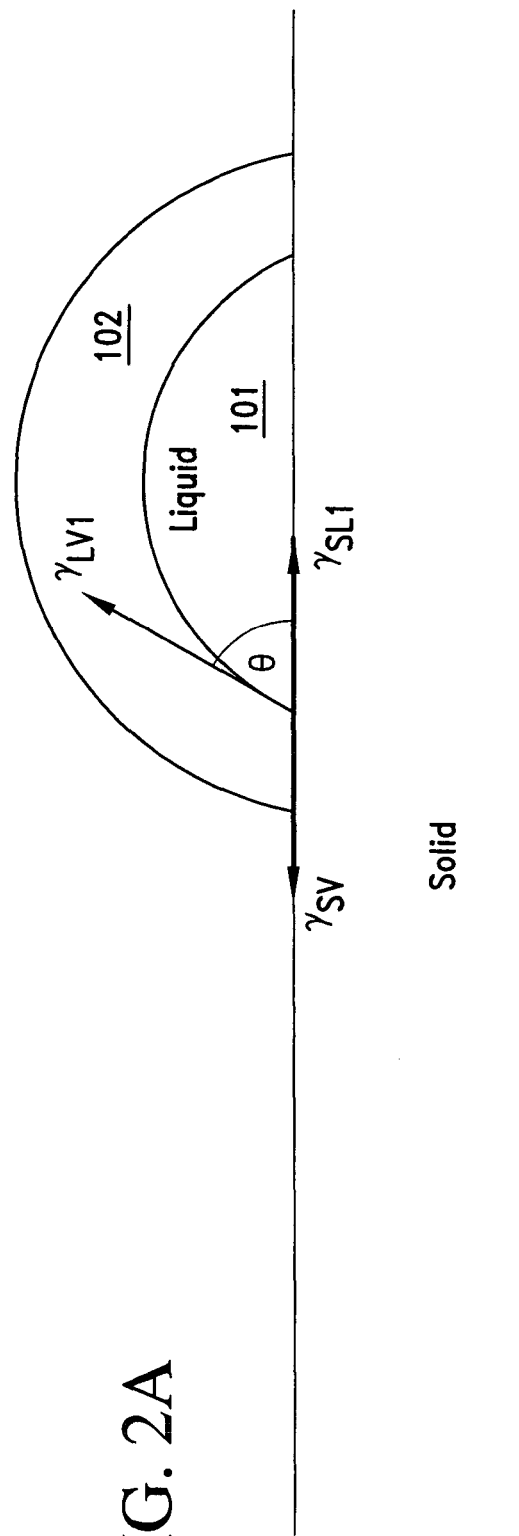
FIG. 2A presents the normal spread of a drop of ink on a substrate.

Under normal conditions any printed feature will spread to a point 100 dictated by the contact angle formed by the liquid (L)-solid (S)-vapor (V) interface, as shown in FIG. 2A. In FIG. 2A, the ink used to print the first printed Feature 101 comprises a liquid comprising a first solvent that generates a first solvent vapor 102. The contact angle θ between the liquid 101 and the first solvent vapor 102 is determined using the equation:

$$\gamma_{LV1}\cos(\theta)=\gamma_{SV}-\gamma_{SL1}$$

wherein $\gamma_{LV1}$ is defined as the liquid-vapor interfacial energy; $\gamma_{SV}$ is defined as the solid-vapor interfacial energy; and $\gamma_{SL1}$ is defined as the solid-liquid interfacial energy.

The spreading of the feature will stop when the edges of the feature reach the maximum contact angle dictated by the conditions of the ink and substrate. Features printed with ink containing volatile, low surface tension solvents are additionally impacted by the evaporation of the volatiles as the material spreads out, causing the ink's surface tension to increase. The dynamic interaction between the ink's changing surface tension, the surface energy of a substrate, and the ambient condition surrounding the ink (vapor) ultimately dictate a printed feature's width in the absence of no other forces influencing the process (heat, blowing air, etc).

Figure 2B:
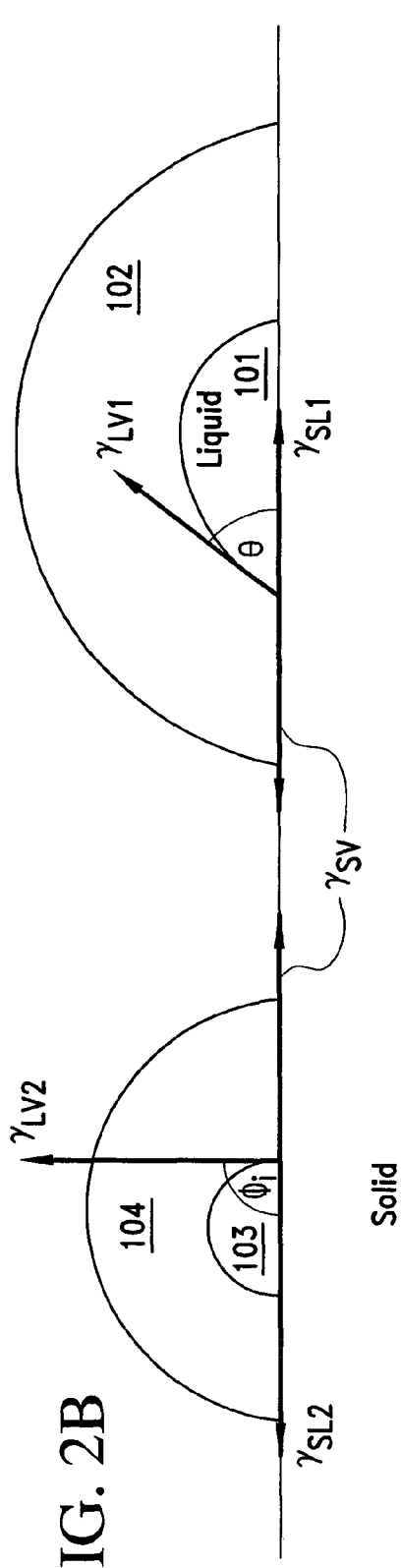
FIGS. 2B and 2C present the effect that two simultaneously printed, adjacent drops of ink would have had on each other's spread.

With reference to FIG. 2B, when a second printed Feature 103 comprising a liquid comprising a second solvent that generates a second solvent vapor 104 is printed in close proximity to the first printed Feature 101, the first printed Feature 101 will spread toward the second printed Feature 103. Eventually, the first solvent vapor 102 and the second solvent vapor 104 overlap.

Shortly after the second printed feature is printed, it will have an initial contact angle ($\Phi_i$) between the second printed Feature 103 and the second solvent vapor 104, wherein $\Phi_i$ is determined using the equation:

$$\gamma_{LV2i}\cos(\Phi_i)=\gamma_{sv}-\gamma_{SL2}$$

wherein $\gamma_{LV2i}$ is defined as the liquid-vapor interfacial energy of the second printed feature in the presence of the first printed feature immediately after the second printed feature is printed; $\gamma_{SV}$ is defined as the solid-vapor interfacial energy of the second printed feature in the presence of the first printed feature immediately after the second printed feature is printed; and $\gamma_{SL2}$ is defined as the solid-liquid interfacial energy of the second printed feature in the presence of the first printed feature immediately after the second printed feature is printed.

Figure 2C:
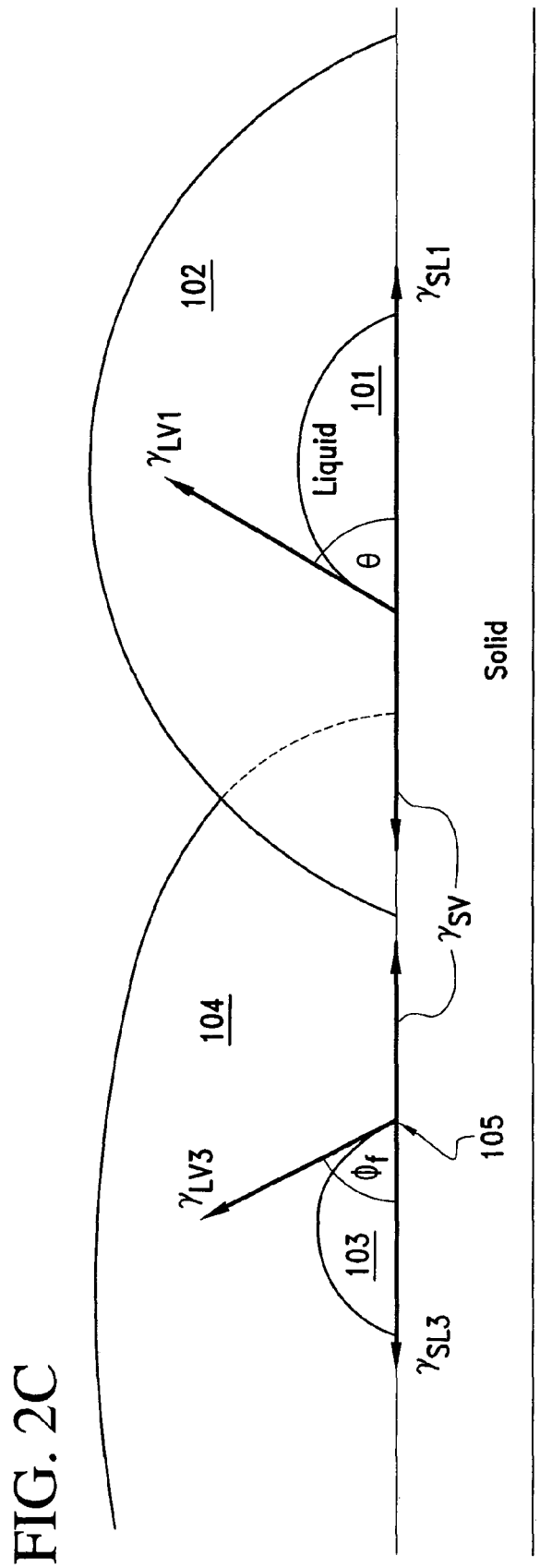

As shown in FIG. 2C, after the second printed feature and is allowed to spread to a maximum point 105. The final contact angle ($\Phi_f$), which is smaller than $\Phi_i$ and greater than θ, is determined using the equation:

$$\gamma_{LV3f}\cos(\Phi_f)=\gamma_{SV}-\gamma_{SL3}$$

wherein $\gamma_{LV3}$ is defined as the liquid-vapor interfacial energy of the second printed feature in the presence of the first printed feature after the second printed feature is allowed to spread to maximum point 105; $\gamma_{SV}$ is defined as the solid-vapor interfacial energy of the second printed feature in the presence of the first printed feature after the second printed feature is allowed to spread to maximum point 105; and $\gamma_{SL3}$ is defined as the solid-liquid interfacial energy of the second printed feature in the presence of the first printed feature after the second printed feature is allowed to spread to maximum point 105. The larger final contact angle, $\Phi_f$, prevents the second printed feature from achieving the same width as it would normally, had the first printed feature not been present. Controlling the volatility or the surface tension of the ink can control the magnitude of the effect on the final contact angle. The substrate can also have an effect on the magnitude of the effect on the final contact angle as well. While not being bound by theory, it is believed that the substrate can alter the $\gamma_{SV}$ and $\gamma_{SL}$ values that determine the initial contact angles. Thus, substrates that demonstrate substantially lower surface energies reduce the effect by generating hydrophobic effects to the point that spreading is not allowed to the extent that would be allowed if the other feature were not present. Capillary, Marangoni, or static electric effects are other forces that may play a role in the effect described above.

Thus, the order in which the features are printed determines which feature will have a smaller dimension than it would in the absence of the feature that is printed first. In one embodiment, therefore, the first feature is printed before the second feature is printed. Alternatively, the second feature is printed before the first feature is printed. In some embodiments, the two features are printed simultaneously. When the two features are printed simultaneously, each feature causes the other feature to have a smaller dimension than it would have had in the absence of the other feature.

In some embodiments, the features comprise substantially parallel lines, each line having a line width, that are printed adjacent to one another. Non-limiting examples of the patterns that can be observed for the two features are shown in FIGS. 3A-3C. The patterns shown in FIGS. 3A-3C, and throughout many of the other figures discussed herein, comprise one or more features that are labeled Feature A, Feature B, and Feature C. While sequential letters have been used to differentiate each feature, the order of the letters does not indicate the order in which the features are printed, unless noted otherwise.

FIG. 3A shows a first feature that does not cause the second feature to have a smaller dimension than it would have had if the first feature were absent, and vice versa. Such a scenario may be encountered, for example, when Feature A is printed and is cured and Feature B is printed after Feature A has cured. This may also occur where the gap between the two features is sufficiently large such that the presence of one feature does not affect the width of the other feature. Feature A in FIG. 3A has a line width x and Feature B has a line width y. The lines have a pitch A. Further, the two features are separated by a gap having a width z. FIG. 3B, in contrast, shows one embodiment of the invention where the first feature is printed before the second feature is printed. Feature A in FIG. 3B has a line width x' and Feature B has a line width y'. The lines have a pitch A'. Further, the two features are separated by a gap having a width z'. In contrast to the width y of Feature B shown in FIG. 3A, the width y' of Feature B shown in FIG. 3B is narrower as a result of forces exerted by Feature A when Feature B is printed after Feature A. The reverse effect is expected (i.e., Feature A narrower than Feature B) when Feature B is printed before Feature A is printed (not shown).

As used herein, the term "forces" means, but is not limited to, vapor effects from the ink (e.g., from one or more solvents in the ink used to print the feature), capillary effects, Marangoni effects, or static electric effects. One or more of these forces causes, for example, Feature B to be narrower than it would be in the absence of Feature A, as shown in FIG. 3B.

FIG. 3C shows one embodiment of the invention where the first feature and the second feature are printed simultaneously. Feature A in FIG. 3C has a line width x" and Feature B has a line width y". The lines have a pitch A". Further, the two features are separated by a gap having a width z". The broken lines in FIG. 3C represent the width that Feature A and Feature B would have had if either feature were printed by itself (i.e., in the absence of the other feature). In the case shown in FIG. 3C, however, Feature A causes Feature B to have a smaller dimension than it would have had in the absence of Feature A, and vice versa. That is, the two features interact with one another to reduce each of their respective widths, x" and y", relative to what the widths would have been if either feature had been printed in the absence of the other feature or if the two features were printed far enough apart such that neither feature is substantially affected by forces exerted by each feature.

As indicated above, the printing process of the invention optionally includes printing a third feature adjacent to either the first or second feature. When the process involves printing a third feature, the features may be printed in any of the following orders: the first feature may be printed after the second and third features are printed; or the second feature may be printed after the first and third features are printed; or the third feature may be printed after the first and second features are printed.

When printing three features, it will sometimes be desirable to print at least two of the features simultaneously. Thus, in one embodiment, the first feature and the second feature may be printed simultaneously before or after the third feature is printed. Alternatively, the second feature and the third feature may be printed simultaneously before or after the first feature is printed. In one other alternative, the first and the third feature may be printed simultaneously before or after the second feature is printed. In still another alternative, all three features are printed simultaneously.

In some embodiments, in the process involving printing three features, the features comprise substantially parallel lines, each line having a line width, and each line being printed sequentially (i.e., no two of the three lines are printed simultaneously) such that the three features are printed adjacent to one another.

Figure 4C:
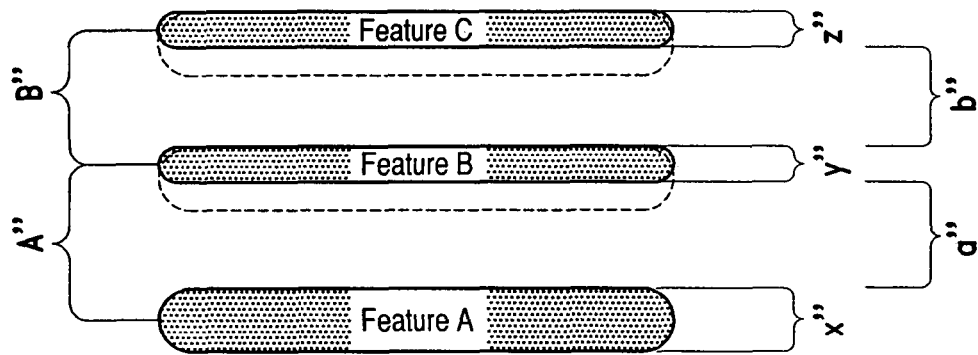
FIGS. 4A-4G present several examples of printed three-line patterns where certain features cause other features to have smaller dimensions than they would in the absence of the certain features.
Figure 4B:
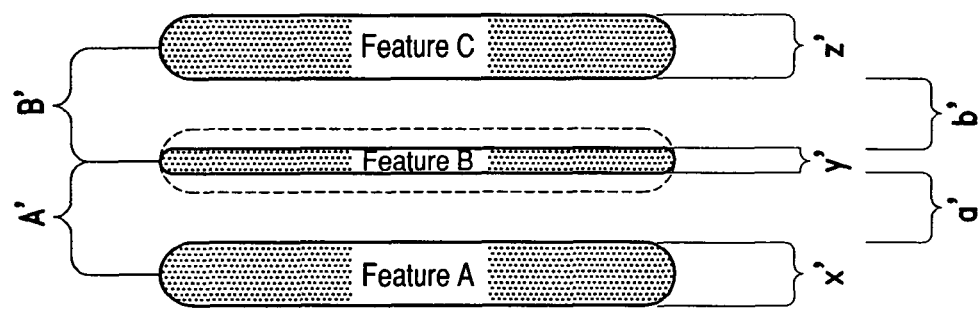
Figure 4A:
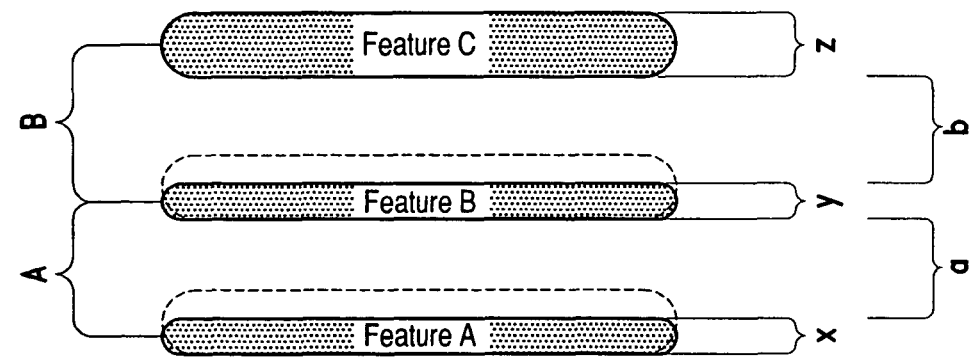

FIGS. 4A-4C illustrate three possible width modification results depending on the order in which the three features are formed, e.g., printed.

FIG. 4A shows one embodiment where the third feature is printed before the first feature and the second feature are printed. In FIG. 4A, Feature C is printed first, Feature B is printed second and Feature A is printed last. Feature A, Feature B and Feature C in FIG. 4A each has a line width of x, y and z, respectively, where Features A and B have a pitch A and Features B and C have a pitch B. Further, Features A and B are separated by a gap having a width a and Features B and C are separated by a gap having a width b. FIG. 4A shows that Feature C causes Feature B to have a smaller dimension than it would in the absence of the Feature C. Feature B, in turn, causes Feature A to have a smaller dimension than it would in the absence of Feature B. The broken lines in FIG. 4A represent the width that Feature B would have had if Feature B were printed in the absence of Feature C and the width that Feature A would have had if Feature A had been printed in the absence of Feature B.

FIG. 4B shows one embodiment where the second feature is printed after the first feature and the third feature are printed. Under these circumstances, the first feature (e.g., Feature C) may be printed before the third feature (e.g., Feature A) or vice versa. But, in any event, the second feature (e.g., Feature B) is printed last. Feature B, in FIG. 4B, has a smaller dimension (e.g., width) than it would have in the absence of Features A and C. Also, Feature B has a smaller dimension (e.g., width) than it would have had if Feature C were printed before Feature A and Feature B are printed, as shown in FIG. 4A, or if Feature A were printed before Feature B and Feature C are printed, as shown in FIG. 4C, below.

Feature A, Feature B and Feature C in FIG. 4B each has a line width of x', y' and z', respectively, where Features A and B have a pitch A' and Features B and C have a pitch B'. Further, Features A and B are separated by a gap having a width a' and Features B and C are separated by a gap having a width b'.

FIG. 4B shows that the forces exerted by Feature C and Feature A cause Feature B to have a smaller dimension than it would in the absence of the Features A and C. The broken lines in FIG. 4B represent the width that Feature B would have had if Feature B were printed in the absence of Features A and C. FIG. 4B shows that the smallest feature dimensions are obtained when a feature is printed in between two other features, since the feature that is printed in the middle (in this case Feature B) will be affected by the forces exerted by both of the two adjacent features (in this case Features A and C).

FIG. 4C shows one embodiment where the first feature is printed before the second feature and the third feature are printed. In FIG. 4C, Feature A is printed first, Feature B is printed second and Feature C is printed last. Feature A, Feature B and Feature C in FIG. 4C each has a line width x", y" and z", respectively, where Features A and B have a pitch A" and Features B and C have a pitch B". Further, Features A and B are separated by a gap having a width a" and Features B and C are separated by a gap having a width b". FIG. 4C shows that Feature A causes Feature B to have a smaller dimension than it would in the absence of the Feature A. In addition, Feature B causes Feature C to have a smaller dimension than it would in the absence of Feature B.

Figure 4G:
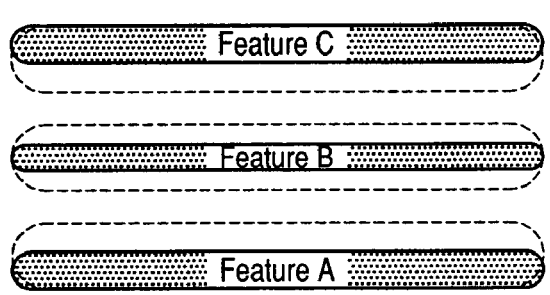
Figure 4F:
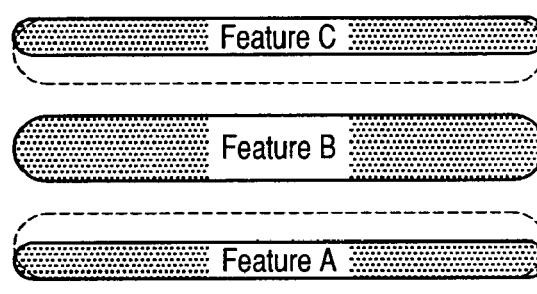
Figure 4E:
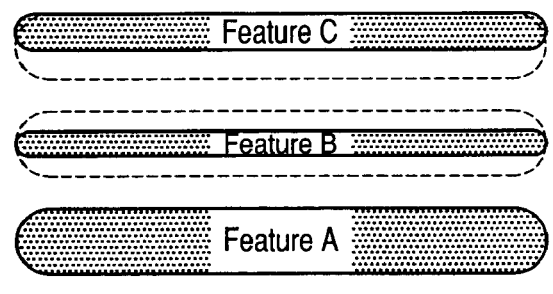
Figure 4D:
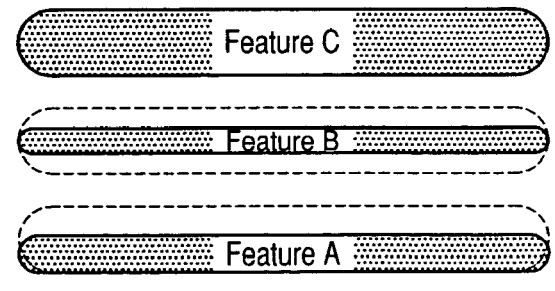

FIGS. 4D-4G show embodiments where at least two features are printed simultaneously and the possible patterns that result from such simultaneous printing. FIG. 4D shows one non-limiting example of a pattern that can be obtained when Feature A and Feature B are printed simultaneously, but subsequently to Feature C. FIG. 4D shows that the forces exerted by Features A and C cause Feature B to have a smaller dimension than it would in the absence of Features A and C. FIG. 4D also shows that the forces exerted by Feature B cause Feature A to have a smaller dimension than it would in the absence of the Feature B. The broken lines that surround Feature B in FIG. 4D represent the width that Feature B would have had if Feature B were printed in the absence of Features A and C. The broken lines that surround Feature A in FIG. 4D represent the width that Feature A would have had if Feature A were printed in the absence of Feature B.

FIG. 4E shows one non-limiting example of a pattern that can be obtained when Feature B and Feature C are printed simultaneously, but subsequently to Feature A. FIG. 4E shows that the forces exerted by Features A and C cause Feature B to have a smaller dimension than it would in the absence of Features A and C. FIG. 4E also shows that the forces exerted by Feature B cause Feature C to have a smaller dimension than it would in the absence of the Feature B. The broken lines that surround Feature B in FIG. 4E represent the width that Feature B would have had if Feature B were printed in the absence of Features A and C. The broken lines that surround Feature C in FIG. 4E represent the width that Feature C would have had if Feature C were printed in the absence of Feature B.

FIG. 4F shows one non-limiting example of a pattern that can be obtained when Feature A and Feature C are printed simultaneously, but subsequently to Feature B. FIG. 4F shows that the forces exerted by Feature B cause Features A and C to have a smaller dimension than it would in the absence of Feature B. The broken lines that surround Features A and C in FIG. 4F represent the width that Features A and C would have had if Features A and C were printed in the absence of Feature B.

Lastly, FIG. 4G shows one non-limiting example of a pattern that can be obtained when Feature A, Feature B and Feature C are printed simultaneously. FIG. 4G shows that the forces exerted by Features A and C cause Feature B to have a smaller dimension than it would in the absence of Features A and C. FIG. 4G also shows that the forces exerted by Feature B cause Feature A and Feature C to have a smaller dimension than it would in the absence of Feature B. The broken lines that surround Feature B in FIG. 4G represent the width that Feature B would have had if Feature B were printed in the absence of Features A and C. The broken lines that surround Features A and C in FIG. 4G represent the width that Features A and C would have had if Features A and C were printed in the absence of Feature B.

Figure 5:
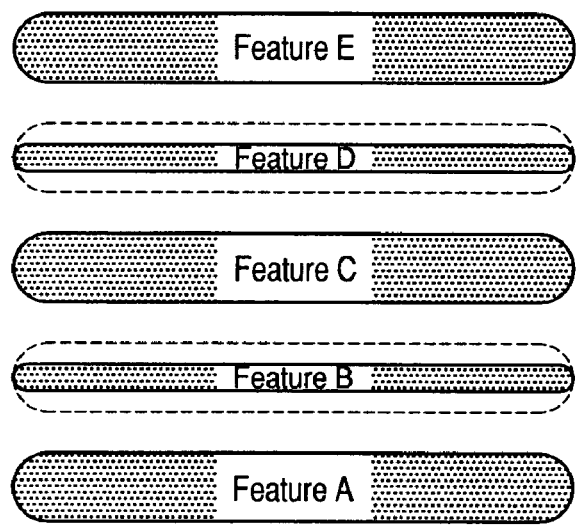
FIG. 5 presents an example of printed five-line pattern where the first, third and fifth features cause the second and fourth features to have a smaller dimension than they would in the absence of the first, third and fifth features.

It should be recognized that a myriad of other multi-line patters with more than three lines; for example, more than four lines; or more than five lines, may be obtained using the inventive printing process disclosed herein. See, e.g., FIG. 5 where Features A, C, and E are printed simultaneously and before Features B and D are printed. In this case, Features B and D may be printed at the same time or one before the other. FIG. 5 shows that Features A, C and E cause Features B and D to have a smaller dimension than they would in the absence of Features A, C and E.

Figure 6A:
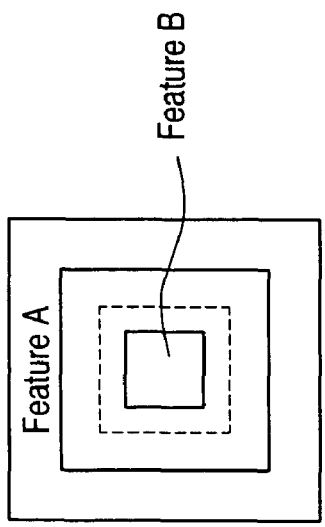
FIGS. 6A-6D present several examples of geometric shapes that may be printed with the printing process of the present invention.
Figure 6B:
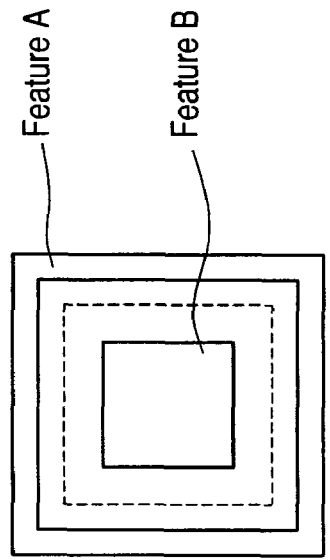

In addition to printing lines, the inventive process may be used to print features comprising substantially concentric geometric shapes. In one embodiment, the concentric geometric shapes are selected from the group consisting of concentric circles and concentric polygons. In one embodiment, the concentric polygons include, but are not limited to concentric triangles, concentric squares, concentric pentagons, concentric hexagons and the like. As was the case with printing lines, the order in which each shape is printed will determine which feature will have a smaller dimension (e.g., width) than it would in the absence of the other feature. FIG. 6A shows a non-limiting example where Feature A is a hollow square and Feature B is a solid square. When Feature A is printed before Feature B, Feature B will have a smaller dimension than it would have had in the absence of Feature A. In FIG. 6A, the broken lines that surround Feature B represent the size that Feature B would have had in the absence of Feature A. In contrast, FIG. 6B shows a pattern observed when Feature B is printed first and Feature A is printed second. As shown in FIG. 6B, Feature A will have a smaller dimension (e.g., width) than it would have had in the absence of Feature B. The broken lines on the inner perimeter of Feature A represent the size that Feature A would have had in the absence of Feature B.

Figure 6C:
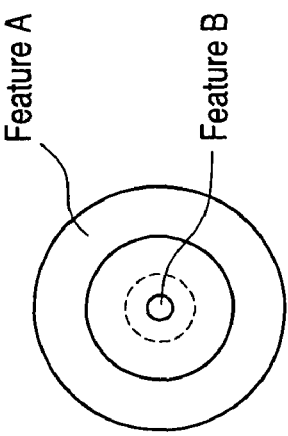
Figure 6D:
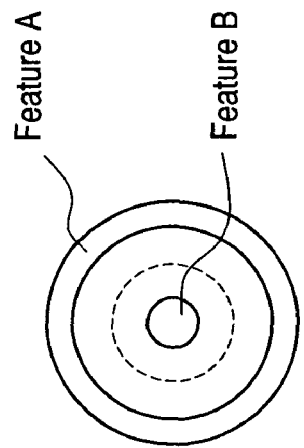

FIG. 6C shows a non-limiting example where Feature A is a hollow circle and Feature B is a solid circle. When Feature A is printed before Feature B, Feature B will have a smaller dimension than it would have had in the absence of Feature A. In FIG. 6C, the broken lines that surround Feature B represent the size that Feature B would have had in the absence of Feature A. In contrast, FIG. 6D shows a pattern observed when Feature B is printed first and Feature A is printed second. As shown in FIG. 6D, Feature A will have a smaller dimension than it would have had in the absence of Feature B. The broken lines on the inner perimeter of Feature A represent the size that Feature A would have had in the absence of Feature B.

Figure 7C:
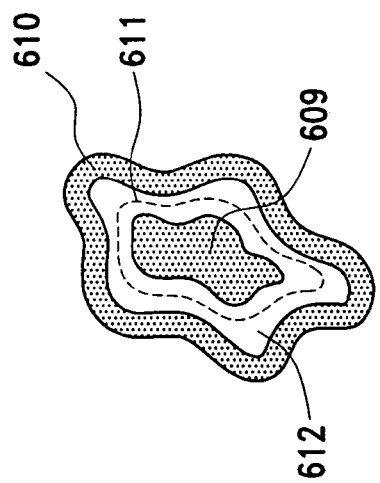
FIGS. 7A-7C present several examples of irregular shapes that may be printed with the printing process of the present invention.
Figure 7B:
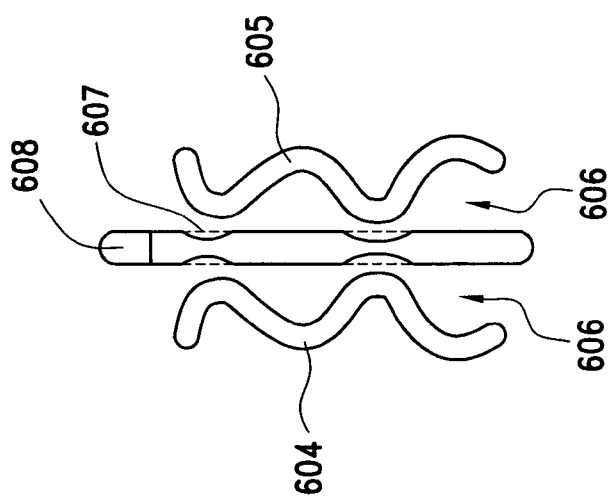
Figure 7A:
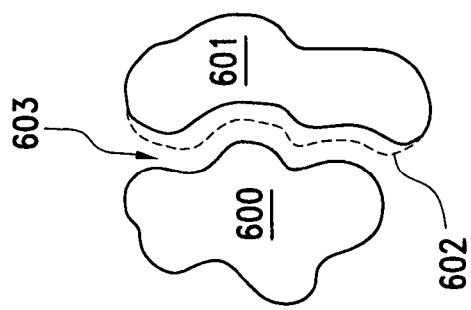

In addition to printing lines and geometric shapes, the inventive process may be used to irregular shapes that are adjacent to one another. Non-limiting examples of the types of irregular shapes that may be printed are shown in FIGS. 7A-7C. In FIG. 7A, for example, feature 600 is printed before feature 601 is printed and there is a gap 603 between the two features. The broken line 602 denotes where feature 601 would extend in the absence of feature 600. Thus, feature 601 has a smaller dimension than it would in the absence of the feature 600.

FIG. 7B shows another non-limiting example where feature 608 is printed between and after features 604 and 605, wherein features 604 and 605 are printed simultaneously. There are gaps, 606, between feature 608 and features 604 and 605. The broken lines 607 denote where the feature 608 would extend in the absence of features 604 and 605. Feature 608, therefore, has a smaller dimension than it would in the absence of the features 604 and 605.

Lastly, FIG. 7C shows yet another non-limiting example where feature 609 is printed after feature 610 and there is a gap 612 between the two features. The broken line 611 denotes where feature 609 would extend in the absence of feature 610. Thus, feature 609 has a smaller dimension than it would in the absence of feature 610.

Figure 8:
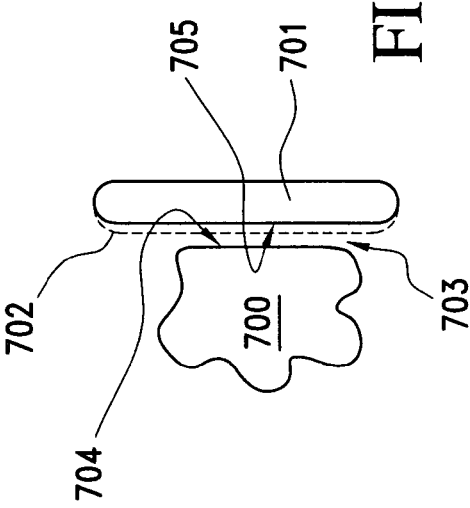
FIG. 8 presents a first feature comprising a first linear edge and a second feature comprising a second linear edge.

The irregular features may comprise linear edges. In one embodiment, the first feature comprises a first linear edge, and the second feature comprises a second linear edge and there is a gap between the first linear edge and the second linear edge. A non-limiting example of this embodiment is shown in FIG. 8, where the first feature, feature 700, has a first linear edge 704 and the second feature, feature 701, has a second linear edge 705. The two features are separated by a gap 703 that separates the first linear edge 704 from the second linear edge 705. The broken line 702 denotes where the feature 701 would extend in the absence of feature 700.

In some embodiments, instead of printing a first feature and a second feature, separated by a gap, under conditions effective for the first feature to cause the second feature to have a smaller dimension than it would in the absence of the first feature, the first feature comprises a vanishing trace. As used herein, the term "vanishing trace" means a trace that may vanish on its own via, e.g., evaporation, or that the trace may require heat, etc., to make it vanish. Further, the vanishing trace may comprise any component of the inks discussed above, so long as it vanishes and does not leave a discernible feature after it vanishes. Thus, in one embodiment, the printing process of the present invention comprises printing a first vanishing trace and a feature, wherein the first vanishing trace and the feature are separated by a gap, under conditions effective for the first vanishing trace to cause the feature to have a smaller dimension than it would in the absence of the first vanishing trace. One advantage of using vanishing traces is that one may obtain single features (i.e., features that do not have adjacent features nearby) with smaller dimensions than they would in the absence of the vanishing trace.

In one embodiment, the printing process further comprises printing a second vanishing trace adjacent to the feature, wherein the second vanishing trace causes the feature to have an even smaller dimension than it would in the absence of the second vanishing trace. In some embodiments, the first vanishing trace is printed before the feature is printed; or the feature is printed before the first vanishing trace is printed; or the feature is printed after the first and second vanishing traces are printed; or the feature is printed before the first and second vanishing traces are printed; or the first vanishing trace is printed before the feature is printed and the feature is printed before the second vanishing trace is printed; or the first and second vanishing traces are printed simultaneously; or the first vanishing trace and the feature are printed simultaneously; or the second vanishing trace and the feature are printed simultaneously.

FIGS. 9A-9C show non-limiting examples of situations where at least one vanishing trace and at least one feature are printed on a substrate, such that there is a gap between the feature and the vanishing trace, and how the at least one vanishing trace causes the at least one feature to have a smaller dimension than it would in the absence of the at least one vanishing trace. FIG. 9A shows a first vanishing trace 800 printed before the feature 801, where there is a gap 802 between the first vanishing trace and the feature. FIG. 9A also shows how the feature has a smaller dimension than it would in the absence of the first vanishing trace—the broken line denotes the dimension the feature would have had in the absence of the vanishing trace. Lastly, FIG. 9A shows the feature 801 after removal of the first vanishing trace.

FIG. 9B shows a first vanishing trace 800 and a second vanishing trace 803 and a feature 801 printed therebetween, where the feature, in this case, is printed after the first and second vanishing traces, and where there are gaps 802 and 804 between the feature 801 and the first and second vanishing traces, 800 and 803, respectively. The feature, 801 in this case, has an even smaller dimension than it would in the absence of the second vanishing trace—the broken line denotes the dimension the feature would have had in the absence of the second vanishing trace. FIG. 9B also shows the feature 801 after removal of the first vanishing trace and the second vanishing trace. When a feature is printed in between two vanishing traces, as depicted in FIG. 9B, the feature will have an even smaller dimension than it would if it were printed adjacent to only one vanishing trace, as depicted in FIG. 9A.

Lastly, FIG. 9C shows a plurality of vanishing traces 805 and a plurality of features 806 (three features are shown) printed on a substrate, with gaps 807 between each feature and each vanishing trace, where the broken lines denote the dimension the plurality of features would have had in the absence of the two adjacent vanishing traces. FIG. 9C also shows the features 806 after removal of all the vanishing traces. In FIG. 9C, the features are substantially parallel lines, each line has a line width 808, a gap separating adjacent lines 809 and each pair of adjacent lines has a pitch 810.

Figure 10:
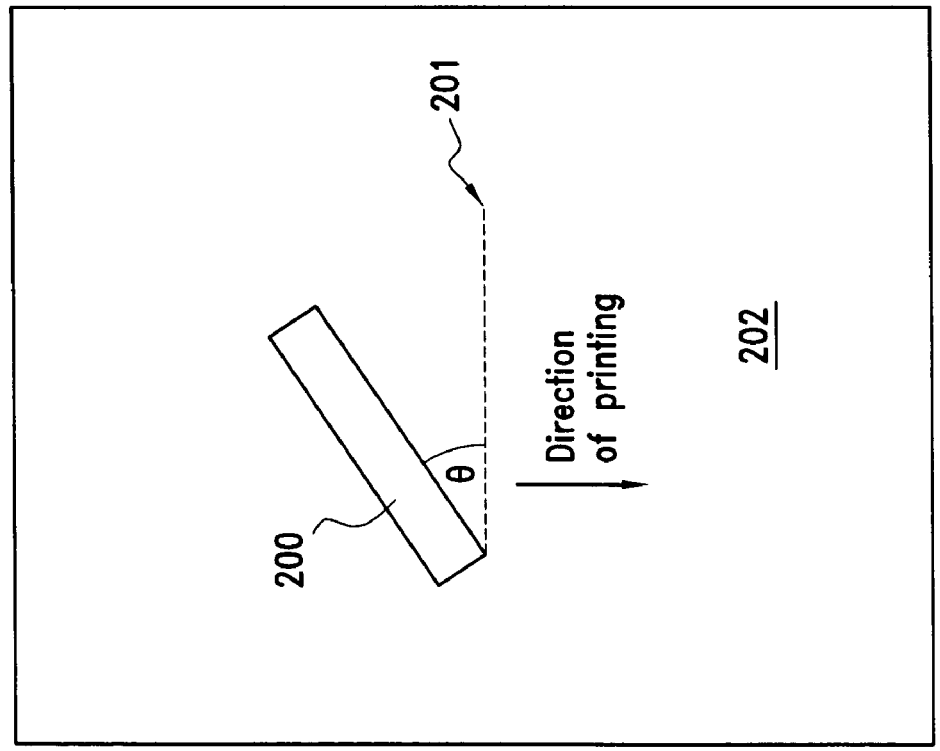
FIG. 10 presents a print head set at a saber angle $\theta$.

It should be understood from the discussion above that it is the forces (e.g., vapor effects from the ink) exerted by the printed features that cause other printed features to have a smaller dimension, and not, for example, changes in the saber angle of the print head used to print the features. As used herein, the term "saber angle" means the angle $\theta$ of the one or more print heads 200, printing on substrate 202, away form the 0° plane 201, as shown in FIG. 10. In some embodiments, however, the saber angle of the print head may be changed to print features so as to increase the number of features, per unit area, that may be printed on a substrate. Changing the saber angle of the print head is advantageous because it not only allows one to print more features per unit area of substrate, but it also allows one to print features of smaller dimensions on account of the forces each feature exerts on an adjacent feature.

Figure 11:
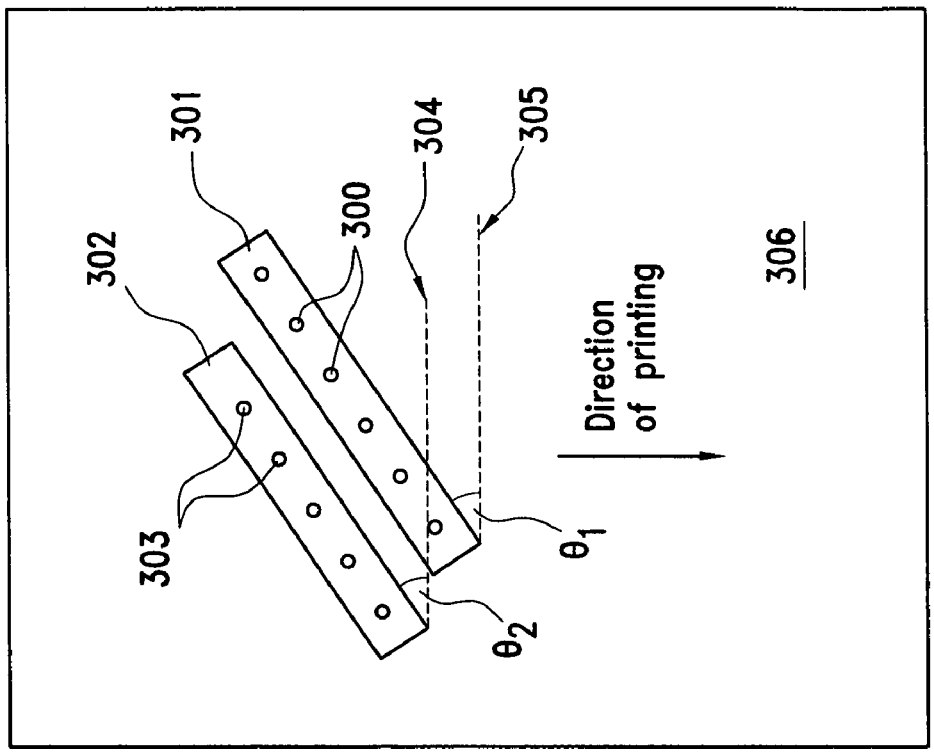
FIG. 11 presents two interlaced print heads set at saber angles $\theta_1$ and $\theta_2$.

In some embodiments, the print head, e.g., ink-jet head, ink-jet device, which includes an ink-jet head, and/or cartridge or other ink delivery system with one or more orifices having a diameter, can be advantageously turned such that its saber angle is greater than 0°. In one embodiment, the printing process of the present invention comprises printing at least two adjacent features, separated by a gap, with one or more printing heads (e.g., ink-jet heads having about 128 nozzles) set at a saber angle effective to increase the number of effective features per unit area. In one embodiment, the saber angle is from about 0 degrees to about 90 degrees; for example, from about 0 degrees to about 88 degrees; or from about 15 degrees to about 84 degrees; or from about 15 degrees to about 60 degrees; or from about 20 degrees to about 45 degrees; or from about 5 to about 15 degrees. When more than one print head is used, each additional print head has the same saber angle as the first print head. In an optional embodiment, each additional print head has a different saber angle as the first print head. Further, each additional print head can be interlaced such that more lines are printed on a substrate per pass relative to when only one print head is used. As used herein, the term "interlaced" means that the nozzles 300 of one print head 301, as seen from below the substrate 306, are staggered relative to the nozzles 302 of any additional print heads 303 as shown in FIG. 11. In FIG. 11, print head 301 is at a saber angle $\theta_1$ relative to the 0° plane 304 and print head 303 is at a saber angle $\theta_2$ relative to 0° plane 305. In one embodiment, $\theta_1$ and $\theta_2$ are each, independently from each other, from about 0 degrees to about 88 degrees; for example, from about 15 degrees to about 60 degrees; or from about 20 degrees to about 45 degrees; or from about 5 to about 15 degrees.

III. Printing

A. Methods

In one embodiment of the present invention, the printing process is a direct-write printing process, although other printing processes may also be used to form the features claimed herein, such as, but not limited to, pen/syringe, continuous or drop on demand ink-jet, droplet deposition, spraying, and offset printing.

The features, can be deposited onto the surface of a substrate using a variety of tools such as, for example, low viscosity deposition tools. As used herein, a low viscosity deposition tool is a device that deposits a liquid or liquid suspension onto a surface by ejecting the composition through an orifice toward the surface without the tool being in direct contact with the surface. The low viscosity deposition tool is preferably controllable over an x-y grid, or an x-y-z grid, referred to herein as a "direct-write" deposition tool. A preferred direct-write deposition tool according to the present invention is an ink-jet device or printer. Other examples of direct-write deposition tools include aerosol jets and automated syringes, such as the MICROPEN® tool, available from Ohmcraft, Inc., of Honeoye Falls, N.Y.

In one embodiment, the ink, is advantageously confined on the substrate, thereby enabling the formation of features having a small minimum feature size, the minimum feature size being the smallest feature dimension in the x-y axis, such as the width of a line or diameter of a circle. In accordance with the direct-write processes, the present invention comprises the formation of features, optionally having a small minimum feature size. For example, the method of the present invention can be used to fabricate features having a minimum feature size of not greater than about 100 µm, e.g., not greater than about 50 µm, not greater than about 10 µm, or not greater than about 1 µm. These feature sizes can be provided using ink-jet printing and other printing approaches that provide droplets or discrete units of composition to a surface.

B. Inks and Ink Treatment

The ink or inks used to form the features of the present invention may comprise a variety of different components including, but not limited to, a vehicle. Ideally, the ink comprises metallic particles, preferably metallic nanoparticles, such as those described in U.S. patent application Ser. Nos. 11/331,230 and 11/331,211, both of which were filed on Jan. 14, 2006 and are incorporated by reference herein.

In one embodiment, the inks further comprise an anti-agglomeration substance, for example, a polymer or a surfactant. In one embodiment, the vehicle comprises (or predominantly consists of) one or more polar components (solvents) such as, e.g., a protic solvent, or one or more aprotic, non-polar components, or a mixture thereof. The vehicle, in an embodiment, is a solvent selected from the group consisting of alcohols, polyols, amines, amides, esters, acids, ketones, ethers, water, saturated hydrocarbons, unsaturated hydrocarbons, and mixtures thereof. In a preferred aspect, the vehicle comprises a mixture of at least two solvents, preferably at least two organic solvents, e.g., a mixture of at least three organic solvents, or at least four organic solvents. The use of more than one solvent is preferred because it allows, inter alia, to adjust various properties of a composition simultaneously (e.g., viscosity, surface tension, contact angle with intended substrate, etc.) and to bring all of these properties as close to the optimum values as possible. Non-limiting examples of vehicles are disclosed in, e.g., U.S. Pat. Nos. 5,853,470; 5,679,724; 5,725,647; 4,877,451; 5,837,045 and 5,837,041, the entire disclosures of which are incorporated by reference herein.

The inks used to form the features of the present invention, in an embodiment, can further comprise one or more additives, such as, but not limited to, adhesion promoters (e.g., shellac, latex, acrylates, and adhesion promoters described in U.S. Pat. No. 5,750,194, which is herein fully incorporated by reference), rheology modifiers (e.g., SOLTHIX® 250 (Avecia Limited), SOLSPERSE® 21000 (Avecia Limited), styrene allyl alcohol (SAA), ethyl cellulose, carboxy methylcellulose, nitrocellulose, polyalkylene carbonates, ethyl nitrocellulose, and the like), surfactants, wetting angle modifiers, humectants, crystallization inhibitors, binders (e.g., latex, shellac, acrylates, polyamic acid polymers, acrylic polymers, PVP, co-polymers of PVP (alkanes, styrenes, etc.), polyfluorosilicate polymers, polyflourinated telomers (including ZONYL® products manufactured by E.I. DuPont de Nemours & Co.), and co-polymers of styrene acrylics (e.g., those sold under the JONCRYL® trade name available from Johnson Polymer Corp.)), dyes/pigments and the like.

Simultaneously with or after the above-described printing step, e.g., immediately after the ink deposition (printing) step, the process optionally further comprises the step of treating and/or curing the ink deposited on the substrate. As used herein, the term "treating" means processing, e.g., by heating or by applying radiation (e.g., IR, UV or microwave radiation), under conditions effective to change a physical or chemical property of the composition (deposited ink) being treated or otherwise modifying the composition, e.g., by forming another layer (such as a coating layer) thereon. Thus, in one aspect, the process further comprises the step of applying heat, ultraviolet radiation, infrared radiation and/or microwave radiation to the printed or otherwise deposited ink. Non-limiting examples of methods for treating the deposited ink in this manner include methods employing a UV, IR, microwave, heat, laser or a conventional light source.

C. Substrates

The inks described above are printed, deposited, or otherwise placed on any of a variety of substrates having myriad surface characteristics, thereby forming, placing, or printing the features of the present invention on the substrate surface.

Non-limiting examples of substrates that are particularly advantageous for printing on or incorporating into the feature include substrates or substrate surfaces comprising one or more of the following: a fluorinated polymer, polyimide, epoxy resin (including glass-filled epoxy resin), polycarbonate, polyester, polyethylene, polypropylene, bi-oriented polypropylene, mono-oriented polypropylene, polyvinyl chloride, ABS copolymer, wood, paper, metallic foil, glass, banknotes, linen, labels (e.g., self adhesive labels, etc.), synthetic paper, flexible fiberboard, non-woven polymeric fabric, cloth and other textiles. Other particularly advantageous substrates include cellulose-based materials such as wood, paper, cardboard, or rayon, and metallic foil and glass (e.g., thin glass).

EXAMPLES

The present invention is further described with reference to the following non-limiting example.

Figure 12:
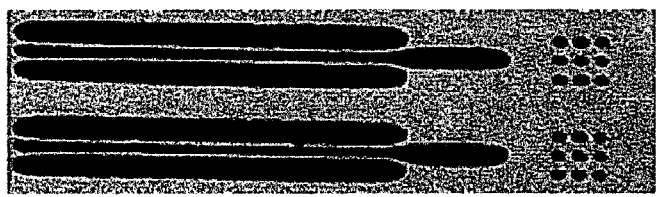
FIG. 12 presents an example of a three-line pattern printed on a substrate.

The inks used to print features according to the present invention were made from a solvent-based ink comprised of silver nanoparticles, such as those described in U.S. patent application Ser. Nos. 11/331,230 and 11/331,211, both of which were filed on Jan. 14, 2006 and are incorporated by reference herein. The inks also comprise ethanol, ethylene glycol, and glycerol. The features were printed by depositing the ink using a Spectra SE-128 128-channel ink jet jetting assembly. The features were printed using the assembly's drop-on-demand technology, with drop placement densities based on 508 dpi resolution. FIG. 12 shows three features printed on a KAPTON® substrate. The features shown in FIG. 12 were printed such that the middle feature was printed last and the features to either side of the middle feature were printed simultaneously. The forces exerted by the features at either side of the middle feature cause the middle feature to have a smaller dimension than it would in the absence of the two features to either side of the middle feature. It is noteworthy that the middle feature widens in the section that is not flanked by the two other features. The section that is not flanked does not experience the forces exerted by the features at either side of the middle feature. Consequently, the section of the middle feature that is not flanked has a wider dimension (e.g., width) than it does in the section that is flanked by the features at either side of the middle feature.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

All U.S. and foreign patent documents discussed above are hereby incorporated by reference into the Detailed Description of the Preferred Embodiment.

What is claimed is:

1. A printing process, comprising:
   printing a first feature and a second feature, separated by a first gap;
   prior to treating the first and second features with heat or radiation, printing a third feature in the first gap, such that the third feature is separated from the first feature by a second gap and separated from the second feature by a third gap, wherein printing the third feature is carried out under conditions effective for the first and second features to cause the third feature to have a smaller dimension than it would in the absence of the first and second features; and
   simultaneously treating each of the first, second, and third features with heat or radiation.

2. The printing process of claim 1, wherein the first feature is printed before the second feature is printed.

3. The printing process of claim 1, wherein the second feature is printed simultaneously with the first feature.

4. The printing process of claim 1, wherein at least one of the first feature and the second feature are vanishing traces.

5. The printing process of claim 1, wherein the features comprise substantially parallel lines.

6. The printing process of claim 5, wherein the substantially parallel lines have a pitch to line width ratio of less than 5:1.

7. The printing process of claim 6, wherein the substantially parallel lines have a pitch to line width ratio of 4:1.

8. The printing process of claim 6, wherein the substantially parallel lines have a pitch to line width ratio of 3:1.

9. The printing process of claim 6, wherein the substantially parallel lines have a pitch to line width ratio of 2:1.

10. The printing process of claim 6, wherein the substantially parallel lines have a pitch to line width ratio of 1:1.

11. The printing process of claim 1, wherein the features comprise substantially concentric geometric shapes.

12. The printing process of claim 11, wherein the concentric geometric shapes are selected from the group consisting of concentric circles and concentric polygons.

13. The printing process of claim 12, the concentric polygons are selected from the group consisting of concentric triangles, concentric squares, concentric pentagons, and concentric hexagons.

14. The printing process of claim 1, wherein at least one of the first feature or the second feature comprise an irregular shape.

15. The printing process of claim 1, wherein the first feature comprises an irregular shape and a first linear edge, and the second feature comprises a second linear edge and wherein the first gap is between the first linear edge and the second linear edge.

16. The printing process of claim 1, wherein at least one of the first feature and the second feature and the third feature comprises metallic nanoparticles.

17. A printing process, comprising:
   printing first and second adjacent features, separated by a first gap;
   prior to treating the first and second features with heat or radiation, printing a third feature in the first gap, such that the third feature is separated from the first feature by a second gap and separated from the second feature by a third gap, wherein printing the third feature is carried out under conditions effective for the first and second features to cause the third feature to have a smaller dimension than it would in the absence of the first and second features, the smaller dimension being a width of the third feature that is at most 10 µm; and simultaneously treating each of the first, second, and third features with heat or radiation.

18. The process of claim 17, wherein the printing is carried out using one or more printing heads set at a saber angle in the range of 5 degrees to 15 degrees.

19. The process of claim 17, wherein the printing is carried out using one or more printing heads set at a saber angle in the range of 0 degrees to 88 degrees.

20. The process of claim 17, wherein the printing is carried out using one or more printing heads set at a saber angle in the range of 15 degrees to 84 degrees.

21. A printing process, comprising: printing a first vanishing trace and a second vanishing trace separated by a first gap; and prior to treating the first and second vanishing traces with heat or radiation, printing a feature in the first gap, such that the feature is separated from the first vanishing trace by a second gap and separated from the second vanishing trace by a third gap, wherein printing the feature is carried out under conditions effective for the first and second vanishing traces to cause the feature to have a smaller dimension than it would in the absence of the first and second vanishing traces.

22. The printing process of claim 21, wherein the first vanishing trace is printed before the feature is printed.

23. The printing process of claim 21, wherein the feature is printed simultaneously with the first vanishing trace.

24. The printing process of claim 21, wherein the feature is printed after the first and second vanishing traces are printed.

25. The printing process of claim 21, wherein the feature is printed simultaneously with the second vanishing trace.

26. The printing process of claim 21, wherein a third vanishing trace is printed before the feature is printed and the feature is printed simultaneously with the first vanishing trace.

27. The printing process of claim 21, wherein the first and second vanishing traces are printed simultaneously.

28. The printing process of claim 21, wherein the first vanishing trace and the feature are printed simultaneously.

29. The printing process of claim 21, wherein the second vanishing trace and the feature are printed simultaneously.

30. The printing process of claim 21, wherein the width of the feature is at most 10 μm.

31. The printing process of claim 21, wherein the feature comprises substantially concentric geometric shapes selected from the group consisting of concentric circles and concentric polygons.

32. The printing process of claim 31, the concentric polygons are selected from the group consisting of concentric triangles, concentric squares, concentric pentagons, and concentric hexagons.

33. The printing process of claim 21, wherein the feature comprises an irregular shape.

34. The printing process of claim 1, wherein the third feature is printed after the first and second features are printed.

35. The printing process of claim 1, wherein the third feature is printed simultaneously with the first and second features.

36. The printing process of claim 1, wherein the second feature and the third feature are printed simultaneously.

37. The printing process of claim 1, wherein the width of the second feature is at most 1 μm.

38. The printing process of claim 1, wherein at least one of the first feature and the second feature and the third feature is transparent or semi-transparent.

\* \* \* \* \*